(12) United States Patent
Kwon

(10) Patent No.: US 12,310,181 B2
(45) Date of Patent: May 20, 2025

(54) TRANSISTOR ARRAY PANEL, MANUFACTURING METHOD THEREOF, AND DISPLAY DEVICE INCLUDING THE SAME

(71) Applicant: Samsung Display Co., Ltd., Yongin-Si (KR)

(72) Inventor: Hyuk Soon Kwon, Asan-si (KR)

(73) Assignee: Samsung Display Co., Ltd., Yongin-si (KR)

( * ) Notice: Subject to any disclaimer, the term of this patent is extended or adjusted under 35 U.S.C. 154(b) by 0 days.

(21) Appl. No.: 18/226,251

(22) Filed: Jul. 26, 2023

(65) Prior Publication Data

US 2023/0371309 A1 Nov. 16, 2023

Related U.S. Application Data

(63) Continuation of application No. 17/225,174, filed on Apr. 8, 2021, now Pat. No. 11,751,433, which is a
(Continued)

(30) Foreign Application Priority Data

Apr. 7, 2016 (KR) ........................ 10-2016-0042782

(51) Int. Cl.
*H10K 59/121* (2023.01)
*H10D 86/40* (2025.01)
(Continued)

(52) U.S. Cl.
CPC ......... *H10K 59/1213* (2023.02); *H10D 86/40* (2025.01); *H10D 86/60* (2025.01); *H10K 59/131* (2023.02); *H10K 71/00* (2023.02)

(58) Field of Classification Search
CPC ............. H01L 27/124; H01L 29/41733; H01L 29/42384; H01L 29/7869; H10K 71/166;
(Continued)

(56) References Cited

U.S. PATENT DOCUMENTS

| | | |
|---|---|---|
| 6,849,877 B2 | 2/2005 | Yamazaki et al. |
| 7,071,488 B2 | 7/2006 | Kimura |

(Continued)

FOREIGN PATENT DOCUMENTS

| | | |
|---|---|---|
| JP | 2013-218345 A | 10/2013 |
| KR | 10-2004-0056665 A | 7/2004 |

(Continued)

OTHER PUBLICATIONS

Korean Notice of Allowance corresponding to Application No. 10-2016-0042782 and issued on May 17, 2023, 8 pages.

*Primary Examiner* — Caleb E Henry
(74) *Attorney, Agent, or Firm* — Innovation Counsel LLP

(57) ABSTRACT

A transistor display panel according to an exemplary embodiment includes: a substrate; a first transistor disposed on the substrate; and a pixel electrode connected to the first transistor, wherein the first transistor includes a lower electrode disposed on the substrate, a first semiconductor overlapping the lower electrode, a first insulating layer covering the first semiconductor, a first gate electrode disposed on the first insulating layer and overlapping the first semiconductor, and a first source connecting member and a first drain connecting member disposed on the same layer as the first gate electrode and connected to the first semiconductor, wherein the first gate electrode is formed as a triple layer, the first source connecting member and first drain connecting member are formed as a double layer, and the first source connecting member is connected to the lower electrode.

20 Claims, 9 Drawing Sheets

Related U.S. Application Data continuation of application No. 16/686,033, filed on Nov. 15, 2019, now Pat. No. 10,991,784, which is a continuation of application No. 15/481,273, filed on Apr. 6, 2017, now Pat. No. 10,483,340.

(51) Int. Cl.
*H10D 86/60* (2025.01)
*H10K 59/131* (2023.01)
*H10K 71/00* (2023.01)

(58) Field of Classification Search
CPC ............ H10K 59/1216; H10K 59/123; H10K 59/124; H10K 59/8051; H10K 59/8052
See application file for complete search history.

(56) References Cited

U.S. PATENT DOCUMENTS

| | | | |
|---|---|---|---|
| 7,897,450 B2 * | 3/2011 | Koehler | H01L 21/0217 438/791 |
| 7,902,640 B2 * | 3/2011 | Hsu | H10D 30/0316 257/E21.293 |
| 8,531,099 B2 | 9/2013 | Koh | |
| 8,878,803 B2 | 11/2014 | Kimura et al. | |
| 8,975,115 B2 | 3/2015 | Endo et al. | |
| 9,006,744 B2 | 4/2015 | Lee et al. | |
| 9,224,870 B2 | 12/2015 | Yamazaki et al. | |
| 9,397,122 B2 | 7/2016 | Lim et al. | |
| 9,853,067 B2 * | 12/2017 | Cai | G02F 1/136213 |
| 9,859,355 B2 | 1/2018 | Lim et al. | |
| 10,083,651 B2 | 9/2018 | Yamazaki et al. | |
| 10,134,912 B2 * | 11/2018 | Kimura | H01L 29/78618 |
| 10,483,339 B2 * | 11/2019 | Moon | H01L 29/7869 |
| 10,700,215 B2 | 6/2020 | Kimura et al. | |
| 10,991,784 B2 * | 4/2021 | Kwon | H10K 59/131 |
| 11,069,817 B2 | 7/2021 | Kimura et al. | |
| 11,430,899 B2 | 8/2022 | Kimura et al. | |
| 11,652,174 B2 | 5/2023 | Kimura et al. | |
| 2004/0227886 A1 | 11/2004 | Kimura | |
| 2005/0275038 A1 * | 12/2005 | Shih | H01L 29/78648 257/382 |
| 2006/0157754 A1 * | 7/2006 | Jeon | H10D 30/69 438/257 |
| 2006/0234430 A1 * | 10/2006 | Liu | H10K 10/474 438/149 |
| 2008/0085583 A1 * | 4/2008 | Park | H01L 21/31637 257/E29.302 |
| 2008/0297678 A1 | 12/2008 | Lee et al. | |
| 2011/0037068 A1 | 2/2011 | Yamazaki et al. | |
| 2011/0053358 A1 | 3/2011 | Torium et al. | |
| 2011/0092017 A1 | 4/2011 | Akimoto et al. | |
| 2011/0156024 A1 | 6/2011 | Koyama et al. | |
| 2011/0157131 A1 | 6/2011 | Miyake | |
| 2013/0050126 A1 | 2/2013 | Kimura et al. | |
| 2013/0270527 A1 * | 10/2013 | Kwon | H10K 59/1216 254/43 |
| 2013/0328044 A1 | 12/2013 | Yamazaki et al. | |
| 2014/0183528 A1 * | 7/2014 | Endo | H01L 27/1296 257/43 |
| 2014/0231797 A1 | 8/2014 | Matsuura | |
| 2014/0273342 A1 * | 9/2014 | Yim | H10D 30/6755 438/104 |
| 2017/0017129 A1 | 1/2017 | Zhao et al. | |
| 2017/0278977 A1 * | 9/2017 | Jeong | H01L 27/1288 |
| 2017/0294498 A1 * | 10/2017 | Kwon | H10K 59/1213 |
| 2018/0026055 A1 * | 1/2018 | Rui | H10D 86/0212 257/71 |
| 2018/0061922 A1 * | 3/2018 | Kim | H10K 59/1213 |
| 2019/0088793 A1 * | 3/2019 | Kimura | H01L 29/78618 |
| 2020/0258966 A1 * | 8/2020 | Cha | H10K 59/1216 |

FOREIGN PATENT DOCUMENTS

| | | |
|---|---|---|
| KR | 10-2012-0017661 A | 2/2012 |
| KR | 10-2015-0033155 A | 4/2015 |
| KR | 10-2015-0059478 A | 6/2015 |
| KR | 10-2015-0126509 A | 11/2015 |
| KR | 10-2016-0005814 A | 1/2016 |
| KR | 10-2016-0021329 A | 2/2016 |

* cited by examiner

TRANSISTOR ARRAY PANEL, MANUFACTURING METHOD THEREOF, AND DISPLAY DEVICE INCLUDING THE SAME

CROSS-REFERENCE TO RELATED APPLICATION

This application is a continuation application of U.S. patent application Ser. No. 17/225,174 filed on Apr. 8, 2021, which is a continuation application of U.S. patent application Ser. No. 16/686,033 filed on Nov. 15, 2019 (now U.S. Pat. No. 10,991,784), which is a continuation application of U.S. patent application Ser. No. 15/481,273 filed on Apr. 6, 2017 (now U.S. Pat. No. 10,483,340), which claims priority under 35 USC § 119 to Korean Patent Application No. 10-2016-0042782 filed in the Korean Intellectual Property Office on Apr. 7, 2016, the entire contents of which are incorporated herein by reference.

BACKGROUND

1. Field

The present disclosure relates to a transistor display panel, a manufacturing method thereof, and a display device including the same.

2. Description of the Related Art

A transistor included in various electronic devices such as a display device generally includes a gate electrode, a source electrode, a drain electrode, and a semiconductor. The transistor is used as a switching element, a driving element, and/or the like in the display device.

The semiconductor is an important factor in determining characteristics of the transistor. The semiconductor mainly includes silicon (Si). The silicon may be one of amorphous silicon and polysilicon according to a crystallization type. Amorphous silicon has a simple manufacturing process but has low charge mobility, which means there is a limit for manufacturing a high performance transistor. Polysilicon has high charge mobility but a process of crystallizing the silicon is required, which means the manufacturing cost is increased and the process is complicated. Recently, studies on a transistor using an oxide semiconductor with a higher on/off ratio and carrier mobility than the amorphous silicon, and lower cost and higher uniformity than polycrystalline silicon, have progressed.

The above information disclosed in this Background section is only for enhancement of understanding of the background of the invention, and therefore it may contain information that does not form the prior art that is already known in this country to a person of ordinary skill in the art.

SUMMARY

An exemplary embodiment reduces manufacturing cost and improves characteristics of a transistor.

A transistor display panel according to an exemplary embodiment includes: a substrate; a first transistor disposed on the substrate; and a pixel electrode connected to the first transistor, wherein the first transistor includes: a first semiconductor on the substrate, a first insulating layer covering the first semiconductor, a first gate electrode overlapping the first semiconductor, and a first connecting member disposed on the same layer as the first gate electrode and connected to the first semiconductor, wherein the first gate electrode includes at least three layers, the first connecting member includes at least two layers The first gate electrode may include a first main gate layer, and a first upper gate layer and a first lower gate layer respectively disposed on and under the first main gate layer.

The first connecting member may include a first source connecting member and a first drain connecting member.

The first source connecting member may include a first main source connecting layer and a first lower source connecting layer disposed thereunder, and the first drain connecting member may include a first main drain connecting layer and a first lower drain connecting layer disposed thereunder.

The first main source connecting layer and the first main drain connecting layer may be disposed on the same layer as the first main gate layer.

A second insulating layer covering the first gate electrode, the first source connecting member, and the first drain connecting member, and a first source electrode and a first drain electrode disposed on the second insulating layer may be further included, and the first source electrode may be connected to the first source connecting member.

A lower electrode under the first semiconductor and connected to the first source connecting member may be further included.

A buffer layer covering the lower electrode may be further included, and the first source connecting member may be connected to the lower electrode through a lower opening of the buffer layer and the first insulating layer.

The first semiconductor may include a first channel, and a first source region and a first drain region disposed at respective sides of the first channel, and the first source region and the first drain region may be respectively connected to the first source connecting member and the first drain connecting member.

A scan line disposed on the substrate, a data line crossing the scan line, and a second transistor connected to the scan line and the data line may be further included, the second transistor may include a second semiconductor disposed at the same layer as the first semiconductor, a second gate electrode overlapping the second semiconductor, and a second source connecting member and a second drain connecting member disposed at the same layer as the second gate electrode and connected to the second semiconductor, wherein the second gate electrode includes at least three layers, and the first source connecting member and the first drain connecting member include at least two layers.

The first semiconductor and the second semiconductor may include an oxide semiconductor material.

Also, a manufacturing method of a transistor display panel according to an exemplary embodiment includes: forming a first semiconductor on a substrate; forming a first insulating layer on the first semiconductor; and forming a first gate electrode, a first connecting member on the first insulating layer, wherein the first gate electrode includes at least three layers, the first connecting member includes at least two layers.

The step of forming the first gate electrode, the first source connecting member, and the first drain connecting member may include depositing a lower electrode layer, a main electrode layer, and an upper electrode layer on the first insulating layer, and patterning the lower electrode layer, the main electrode layer, and the upper electrode layer by using a half-tone mask to form the first gate electrode as at least three layers and a first source connecting member and the first drain connecting member as at least two layers, wherein the first connecting member may include a first source connecting member and a first drain connecting member.

The first gate electrode may include: a first main gate layer, and a first upper gate layer and a first lower gate layer respectively disposed on and under the first main gate layer; the first source connecting member may include a first main source connecting layer and a first lower source connecting layer disposed thereunder; and the first drain connecting member may include a first main drain connecting layer and a first lower drain connecting layer disposed thereunder.

The manufacturing method may further include forming a lower electrode on a substrate; forming a second insulating layer covering the first gate electrode, the first source connecting member, and the first drain connecting member, and forming a first source electrode and a first drain electrode on the second insulating layer, wherein the first source electrode may be connected to the first source connecting member and the first source connecting member is connected to the lower electrode.

The method may further include forming a buffer layer covering the lower electrode, and forming an opening overlapping the lower electrode in the buffer layer and the first insulating layer, wherein the first source connecting member may be connected to the lower electrode through the opening.

Further, a display device including a transistor display panel according to an exemplary embodiment includes: a substrate; a first transistor disposed on the substrate; and a light-emitting diode element connected to the first transistor, wherein the first transistor includes a lower electrode disposed on the substrate, a first semiconductor overlapping the lower electrode, a first insulating layer covering the first semiconductor, a first gate electrode disposed on the first insulating layer and overlapping the first semiconductor, and a first source connecting member and a first drain connecting member disposed on the same layer as the first gate electrode and connected to the first semiconductor, wherein the first gate electrode includes at least three layers, the first connecting member includes at least two layers, and the first connecting member is connected to the lower electrode.

The first connecting member may include a first source connecting member and a first drain connecting member.

The first gate electrode may include a first main gate layer, and a first upper gate layer and a first lower gate layer respectively disposed on and under the first main gate layer, the first source connecting member may include a first main source connecting layer and a first lower source connecting layer disposed thereunder, and the first drain connecting member may include a first main drain connecting layer and a first lower drain connecting layer disposed thereunder.

A scan line disposed on the substrate, a data line crossing the scan line, and a second transistor connected to the scan line and the data line may be further included, the second transistor may include a second semiconductor disposed at the same layer as the first semiconductor, a second gate electrode overlapping the second semiconductor, and a second source connecting member and a second drain connecting member disposed on the same layer as the second gate electrode and connected to the second semiconductor, the second gate electrode includes at least three layers, and the first source connecting member and the first drain connecting member include at least two layer.

The first semiconductor and the second semiconductor may include an oxide semiconductor material.

The light-emitting diode element may include an organic light emitting diode.

According to exemplary embodiments, the number of manufacturing processes and the manufacturing time may be minimized, thereby reducing the manufacturing cost.

Also, characteristics of the transistor such as reliability may be improved.

DETAILED DESCRIPTION OF THE EMBODIMENTS

Figure 1:
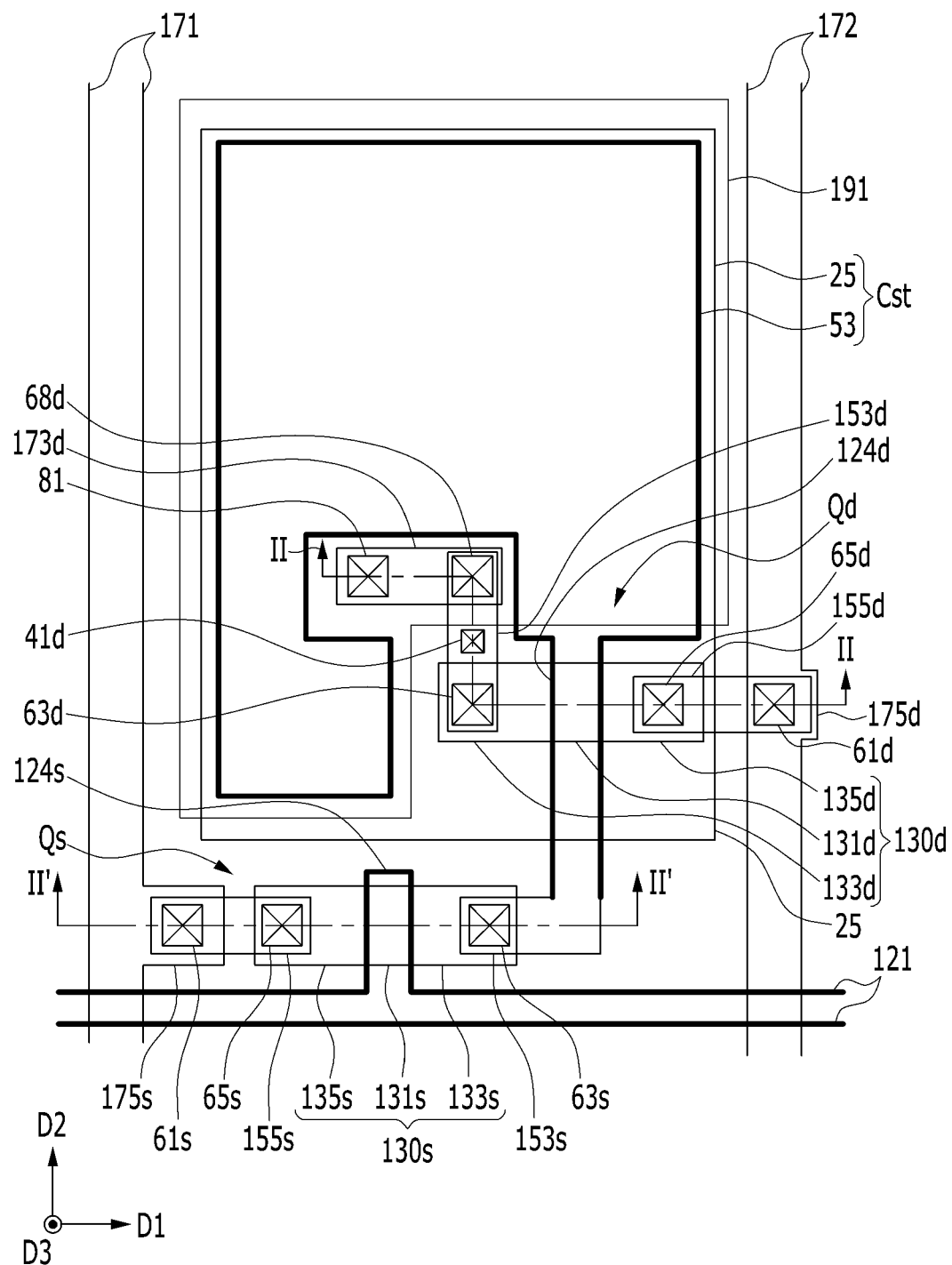
FIG. 1 is a top plan view of a transistor display panel according to an exemplary embodiment.

The present disclosure will be described more fully hereinafter with reference to the accompanying drawings, in which exemplary embodiments of the invention are shown. As those skilled in the art would realize, the described embodiments may be modified in various different ways, all without departing from the spirit or scope of the present disclosure.

To clearly explain the present disclosure, portions that are not directly related to the present disclosure are omitted, and the same reference numerals are attached to the same or similar constituent elements through the entire specification.

In addition, the size and thickness of each configuration shown in the drawings are arbitrarily shown for better understanding and ease of description, and the present disclosure is not limited thereto. In the drawings, the thickness of layers, films, panels, regions, etc., are exaggerated for clarity. In the drawings, for better understanding and ease of description, the thicknesses of some layers and areas are exaggerated.

It will be understood that when an element such as a layer, film, region, or substrate is referred to as being "on" another element, it may be directly on the other element or intervening elements may also be present. In contrast, when an element is referred to as being "directly on" another element, there are no intervening elements present. Further, in the specification, the word "on" or "above" means positioned on or below the object portion, and does not necessarily mean positioned on the upper side of the object portion based on a gravitational direction.

In addition, unless explicitly described to the contrary, the word "comprise" and variations such as "comprises" or "comprising" will be understood to imply the inclusion of stated elements but not the exclusion of any other elements.

Further, throughout the specification, the phrase "in a plan view" means viewing a target portion from the top, and the phrase "in a cross-sectional view" means viewing a cross-section formed by vertically cutting a target portion from the side.

Now, a transistor display panel according to an exemplary embodiment will be described with reference to FIG. 1 and FIG. 2.

Figure 2:
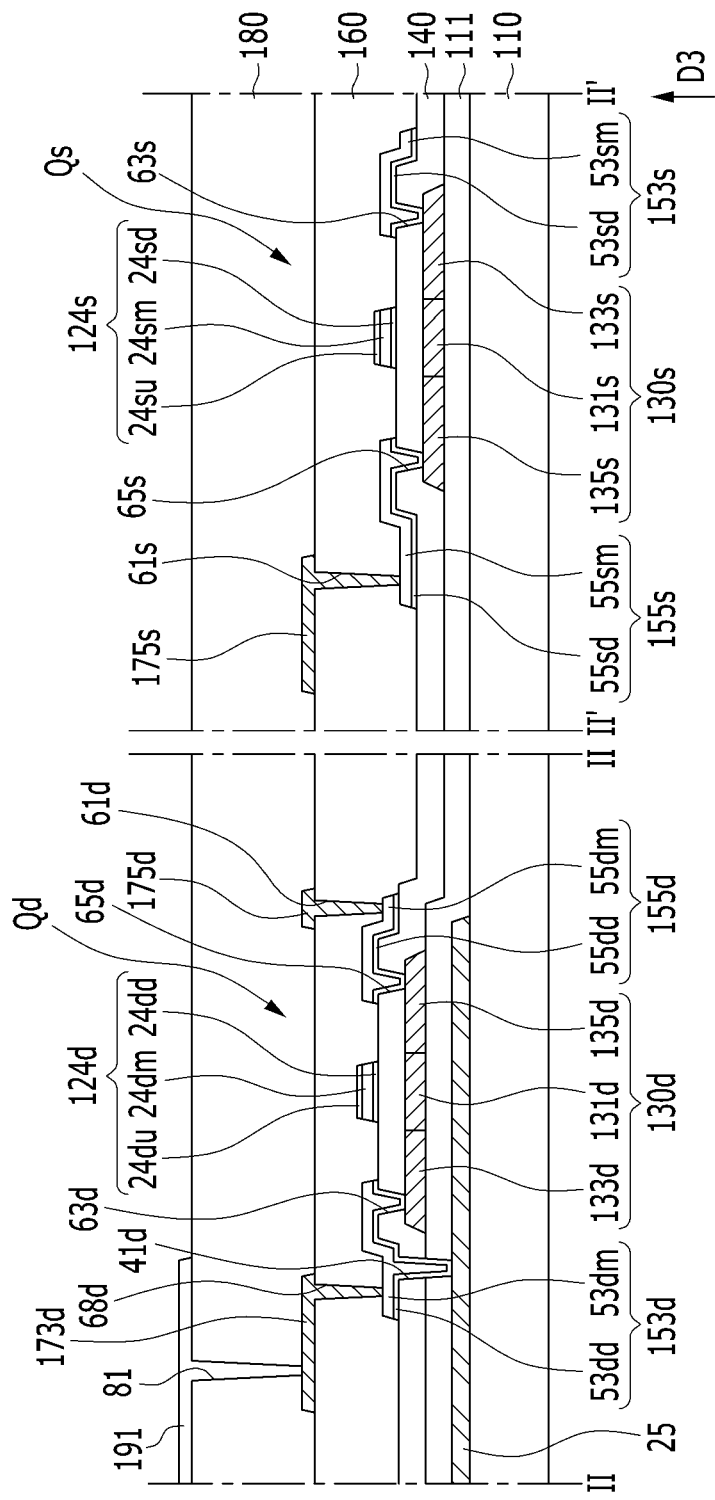
FIG. 2 is a cross-sectional view taken along lines II-II and II'-II' of FIG. 1.

FIG. 1 is a top plan view of a transistor display panel according to an exemplary embodiment, and FIG. 2 is a cross-sectional view taken along lines II-II and II'-II' of FIG. 1.

While FIG. 2 is the cross-sectional view of the transistor display panel shown in FIG. 1 taken along the lines II-II and II-II', a plane structure of the transistor display panel having a cross-sectional structure like in FIG. 2 is not limited to that of FIG. 1. FIG. 1 shows a part of the transistor display panel of an organic light emitting diode display including a driving transistor Qd and a switching transistor Qs; however, an exemplary embodiment is not limited to the organic light emitting diode display, and may be applied to various display devices such as a liquid crystal display.

Referring to FIG. 1 and FIG. 2, a transistor display panel according to an exemplary embodiment includes a substrate 110 including an insulating material such as plastic and glass, and a plurality of transistors Qd and Qs positioned on the substrate 110. When the display device is the organic light emitting diode display, the transistors Qd and Qs may be a driving transistor Qd or a switching transistor Qs positioned in a pixel area.

In the drawing, a first direction D1 and a second direction D2 are parallel to a surface shown when viewing in a direction perpendicular to a surface of the substrate 110 and are perpendicular to each other, and a third direction D3 is perpendicular to the first and second directions D1 and D2 and is substantially perpendicular to the surface of the substrate 110. The third direction D3 may be mainly represented in the cross-sectional structure, and is referred to as a cross-sectional direction. A structure shown when observing the surface parallel to the first direction D1 and the second direction D2 is referred to as a plane structure. In the cross-sectional structure, if a constituent element is positioned on another constituent element, it means that two constituent elements are arranged in the third direction D3, and other constituent elements may be positioned between the two constituent elements.

The driving transistor Qd includes a first semiconductor 130d, a first gate electrode 124d, a first source electrode 173d, and a first drain electrode 175d. Also, the switching transistor Qs includes a second semiconductor 130s, a second gate electrode 124s, a second source electrode 153s, and a second drain electrode 175s.

In this case, the first semiconductor 130d includes a first channel 131d, and a first source region 133d and a first drain region 135d positioned at respective sides of the first channel 131d, and the second semiconductor 130s includes a second channel 131s, and a second source region 133s and a second drain region 135s positioned at respective sides of the second channel 131s.

Next, for better comprehension and ease of description, each of constituent elements that are sequentially deposited will be described with reference to FIG. 1 and FIG. 2.

A lower electrode 25 is positioned on the substrate 110. The substrate 110 may be formed as an insulating substrate made of glass, quartz, ceramic, metal, plastic, or the like, and the lower electrode 25 may be formed as a multilayer having a metal layer including one among copper (Cu), copper alloys, aluminum (Al), and aluminum alloys, and a metal layer including one among molybdenum (Mo) and molybdenum alloys.

A buffer layer 111 is positioned on the substrate 110 and the lower electrode 25. The buffer layer 111 covers the substrate 110 and the lower electrode 25. The buffer layer 111 may include an inorganic insulating material such as a silicon oxide (SiOx), a silicon nitride (SiNx), aluminum oxide (Al2O3), hafnium oxide (HfO3), and yttrium oxide (Y2O3). The buffer layer 111 may be a single layer or a multilayer. For example, when the buffer layer 111 is a double layer, a lower layer thereof may include a silicon nitride (SiNx) and an upper layer thereof may include a silicon oxide (SiOx). The buffer layer 111 serves to flatten a surface while preventing undesirable materials such as impurities or moisture from permeating.

The first semiconductor 130d and the second semiconductor 130s are positioned on the buffer layer 111 to be separated from each other. The first semiconductor 130d and the second semiconductor 130s may be made of an oxide semiconductor material. The oxide semiconductor material may include a metal oxide semiconductor, and may include oxides of metals such as zinc (Zn), indium (In), gallium (Ga), tin (Sn), and titanium (Ti), or a combination of metals such as zinc (Zn), indium (In), gallium (Ga), tin (Sn), and titanium (Ti), and oxides thereof. In further detail, the oxide may include at least one among zinc oxide (ZnO), zinc-tin oxide (ZTO), zinc-indium oxide (ZIO), indium oxide (InO), titanium oxide (TiO), indium-gallium-zinc oxide (IGZO), and indium-zinc-tin oxide (IZTO).

The first source region 133d, the first drain region 135d, the second source region 133s, and the second drain region 135s may further include hydrogen (H) along with the oxide semiconductor material. Hydrogen (H) is diffused in the oxide semiconductor material such that the first source region 133d, the first drain region 135d, the second source region 133s, and the second drain region 135s are conductive.

A first insulating layer 140 covering the buffer layer 111, the first semiconductor 130d, and the second semiconductor 130s is positioned thereon. The first insulating layer 140 may include at least one among a silicon oxide (SiOx), a silicon nitride (SiNx), a silicon oxynitride (SiON), aluminum oxide (Al2O3), hafnium oxide (HfO3), and yttrium oxide (Y2O3).

The first insulating layer 140 may have a first opening 63d overlapping the first source region 133d, a second opening 65d overlapping the first drain region 135d, a third opening 63s overlapping the second source region 133s, and a fourth opening 65s overlapping the second drain region 135s. Also, the buffer layer 111 and the first insulating layer 140 may have a lower opening 41d overlapping the lower electrode 25.

The first gate electrode 124d, the second gate electrode 124s, a scan line 121, a storage electrode 53, a first source connecting member 153d, a first drain connecting member 155d, a second drain connecting member 155s, and the second source electrode 153s are positioned on the first insulating layer 140. As shown in FIG. 1, the first gate electrode 124d extends from the scan line 121 in the first channel 131d direction, and ends of the second gate electrode 124s are integrally connected to the storage electrode 53 and the second source electrode 153s, respectively.

The first gate electrode 124d, the second gate electrode 124s, the scan line 121, and the storage electrode 53 have a structure in which three layers are deposited. That is, the first gate electrode 124d includes a first main gate layer 24dm, and a first upper gate layer 24du and a first lower gate layer 24dd respectively positioned on and under the first main gate layer 24dm. Also, the second gate electrode 124s includes a second main gate layer 24sm, and a second upper gate layer 24*su* and a second lower gate layer 24*sd* respectively positioned on and under the second main gate layer 24*sm*.

In contrast, the first source connecting member 153*d*, the first drain connecting member 155*d*, the second drain connecting member 155*s*, and the second source electrode 153*s* have a structure in which two layers are deposited. That is, the first source connecting member 153*d* includes a first main source connecting layer 53*dm* and a first lower source connecting layer 53*dd* positioned thereunder, and the first drain connecting member 155*d* includes a first main drain connecting layer 55*dm* and a first lower drain connecting layer 55*dd* positioned thereunder. Also, the second drain connecting member 155*s* includes a second main drain connecting member 55*sm* and a second lower drain connecting member 55*sd* positioned thereunder, and the second source electrode 153*s* includes a second main source electrode 53*sm* and a second lower source electrode 53*sd* positioned thereunder.

The first main gate layer 24*dm*, the second main gate layer 24*sm*, the first main source connecting layer 53*dm*, the first main drain connecting layer 55*dm*, the second main drain connecting member 55*sm*, and the second main source electrode 53*sm* may be a metal layer including one among copper (Cu), copper alloys, aluminum (Al), and aluminum alloys. Also, the first lower gate layer 24*dd*, the first upper gate layer 24*du*, the second lower gate layer 24*sd*, the second upper gate layer 24*su*, the first lower drain connecting layer 55*dd*, the second lower drain connecting member 55*sd*, the first lower source electrode 53*dd*, and the second lower source electrode 53*sd* may be a metal layer including one of molybdenum (Mo) and titanium (Ti).

The first source connecting member 153*d* connects the first source region 133*d* and the lower electrode 25 through the first opening 63*d*. The first drain connecting member 155*d* is connected to the first drain region 135*d* through the second opening 65*d*. The second source electrode 153*s* is connected to the second source region 133*s* through the third opening 63*s*, and the second drain connecting member 155*s* is connected to the second drain region 135*s* through the fourth opening 65*s*.

A second insulating layer 160 covering the first insulating layer 140, the first gate electrode 124*d*, the second gate electrode 124*s*, the scan line 121, the storage electrode 53, the first source connecting member 153*d*, the first drain connecting member 155*d*, the second drain connecting member 155*s*, and the second source electrode 153*s* is positioned thereon.

The second insulating layer 160 has a first contact hole 68*d* overlapping the first source connecting member 153*d*, a second contact hole 61*d* overlapping the first drain connecting member 155*d*, and a third contact hole 61*s* overlapping the second drain connecting member 155*s*.

The second insulating layer 160 may include an insulating material such as a silicon oxide (SiOx), a silicon nitride (SiNx), a silicon oxynitride (SiON), aluminum oxide (Al2O3), hafnium oxide (HfO3), and yttrium oxide (Y2O3).

A component such as hydrogen included in a gas such as silane (SiH4) and ammonia (NH3) used in a layer formation process of the second insulating layer 160 may be diffused in the first source region 133*d*, the first drain region 135*d*, the second source region 133*s*, and the second drain region 135*s* such that the first source region 133*d*, the first drain region 135*d*, the second source region 133*s*, and the second drain region 135*s* have low resistance. Also, the component such as hydrogen (H) included in the second insulating layer 160 after the layer formation of the second insulating layer 160 may be diffused such that the first source region 133*d*, the first drain region 135*d*, the second source region 133*s*, and the second drain region 135*s* have low resistance.

In this case, since the first gate electrode 124*d* and the second gate electrode 124*s* are formed as a triple layer, hydrogen (H) of the second insulating layer 160 may be prevented from being diffused in the first channel 131*d* and the second channel 131*s* that overlap the first gate electrode 124*d* and the second gate electrode 124*s*. In contrast, since the first source connecting member 153*d*, the first drain connecting member 155*d*, the second drain connecting member 155*s*, and the second source electrode 153*s* are formed a double layer, hydrogen (H) of the second insulating layer 160 is easily diffused in the first source region 133*d*, the first drain region 135*d*, the second source region 133*s*, and the second drain region 135*s*.

As above-described, the first gate electrode 124*d* and the second gate electrode 124*s* are formed as a triple layer, and the first source connecting member 153*d*, the first drain connecting member 155*d*, the second drain connecting member 155*s*, and the second source electrode 153*s* are formed as a double layer; therefore, only the first source region 133*d*, the first drain region 135*d*, the second source region 133*s*, and the second drain region 135*s* may be conductive. Accordingly, a process of separately etching the first insulating layer 140 covering the first semiconductor 130*d* and the second semiconductor 130*s* to only expose the first source region 133*d*, the first drain region 135*d*, the second source region 133*s*, and the second drain region 135*s* may be omitted.

Also, since the first insulating layer 140 is positioned between the first gate electrode 124*d*, and the first source region 133*d* and the first drain region 135*d*, a parasitic capacitance formed between the first gate electrode 124*d*, and the first source region 133*d* and the first drain region 135*d*, may be minimized. Also, since the first insulating layer 140 is positioned between the second gate electrode 124*s*, and the second source region 133*s* and the second drain region 135*s*, the parasitic capacitance formed between the second gate electrode 124*s*, and the second source region 133*s* and the second drain region 135*s*, may be minimized. Accordingly, reliability of the transistor may be improved.

As shown in FIG. 1 and FIG. 2, a data line 171 having the second drain electrode 175*s*, a driving voltage line 172 having the first drain electrode 175*d*, and the first source electrode 173*d* are positioned on the second insulating layer 160.

The data line 171 transmits a data signal Dm and extends in a direction crossing the scan line 121. The driving voltage line 172 transmits a driving voltage ELVDD, is separated from the data line 171, and extends in the same direction in which the data line 171 extends.

The first source electrode 173*d* is connected to the first source connecting member 153*d* through the first contact hole 68*d*, and the first drain electrode 175*d* is connected to the first drain connecting member 155*d* through the second contact hole 61*d*. Also, the second drain electrode 175*s* is connected to the second drain connecting member 155*s* through the third contact hole 61*s*.

The first source electrode 173*d* is connected to the first source connecting member 153*d* through the first contact hole 68*d*, and the first source connecting member 153*d* connects the first source region 133*d* through the first opening 63*d* and the lower electrode 25 through the lower opening 41*d*, such that the first source electrode 173*d* is connected to the lower electrode 25. Accordingly, the source voltage as a voltage of the first source region 133*d* may be applied to the lower electrode 25.

As above-described, if the source voltage is applied to the lower electrode 25, a current slope decreases in a saturation region of a voltage-current characteristic graph of the driving transistor Qd such that an output saturation characteristic of the driving transistor Qd may be improved.

Also, since the first source region 133d and the lower electrode 25 are connected by using the first source connecting member 153d positioned on the first insulating layer 140, the depth of the lower opening 41d formed in the first insulating layer 140 and the buffer layer 111 decreases. As above-described, the depth of the lower opening 41d formed in the first insulating layer 140 and the buffer layer 111 to connect the first source connecting member 153d and the lower electrode 25 is small, and as such, the time of the etching process to form the lower opening 41d may be shortened.

On the other hand, since the second source electrode 153s connected to the second source region 133s through the third opening 63s is integrally connected to the first gate electrode 124d, the data signal Dm transmitted through the switching transistor Qs is transmitted to the first gate electrode 124d of the driving transistor Qd.

The lower electrode 25 may function as a light blocking film. That is, the lower electrode 25 prevents external light from reaching the first semiconductor 130d such that a characteristic deterioration of the first semiconductor 130d may be prevented and a leakage current of the driving transistor Qd may be controlled.

A passivation layer 180 is positioned on the first source electrode 173d, the first drain electrode 175d, and the second drain electrode 175s.

The passivation layer 180 may include at least one of an inorganic insulating material and an organic insulating material, and may be made of a single layer or a multilayer. An upper surface of the passivation layer 180 may be substantially flat. The passivation layer 180 has a pixel contact hole 81 overlapping the first source electrode 173d.

A pixel electrode 191 is positioned on the passivation layer 180, and the pixel electrode 191 may be made of a transparent conductive material such as indium tin oxide (ITO), indium zinc oxide (IZO), zinc oxide (ZnO), or indium oxide (In2O3), or a reflective metal such as lithium (Li), calcium (Ca), lithium fluoride/calcium (LiF/Ca), lithium fluoride/aluminum (LiF/Al), aluminum (Al), silver (Ag), magnesium (Mg), or gold (Au). The pixel electrode 191 is electrically connected to the first source electrode 173d of the driving transistor Qd through the pixel contact hole 81 formed in the passivation layer 180.

Next, a manufacturing method of the transistor display panel shown in FIG. 1 and FIG. 2 will be described in detail with reference to FIG. 3 to FIG. 7.

Figure 3:
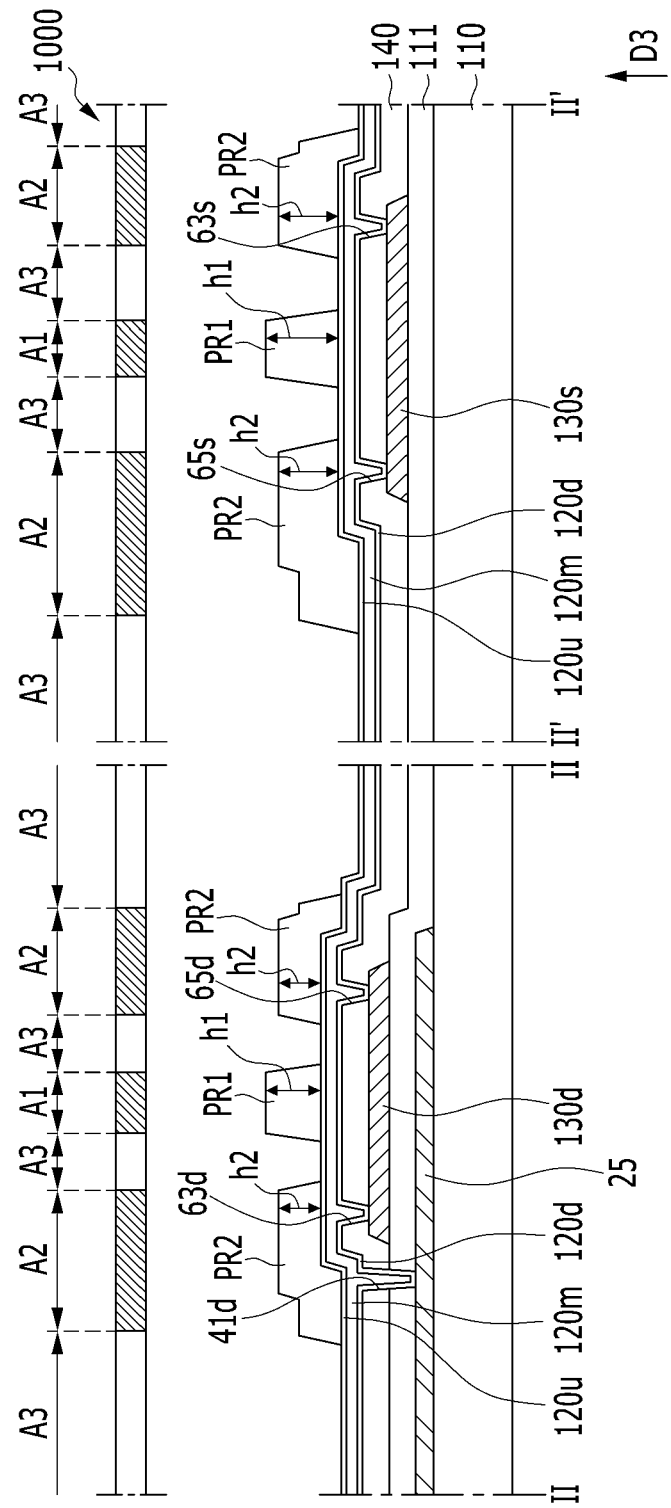
FIG. 3, FIG. 4 and FIG. 5 are cross-sectional views showing a manufacturing method of a transistor display panel according to an exemplary embodiment as cross-sectional views taken along lines II-II and II'-II' of FIG. 1.
Figure 4:
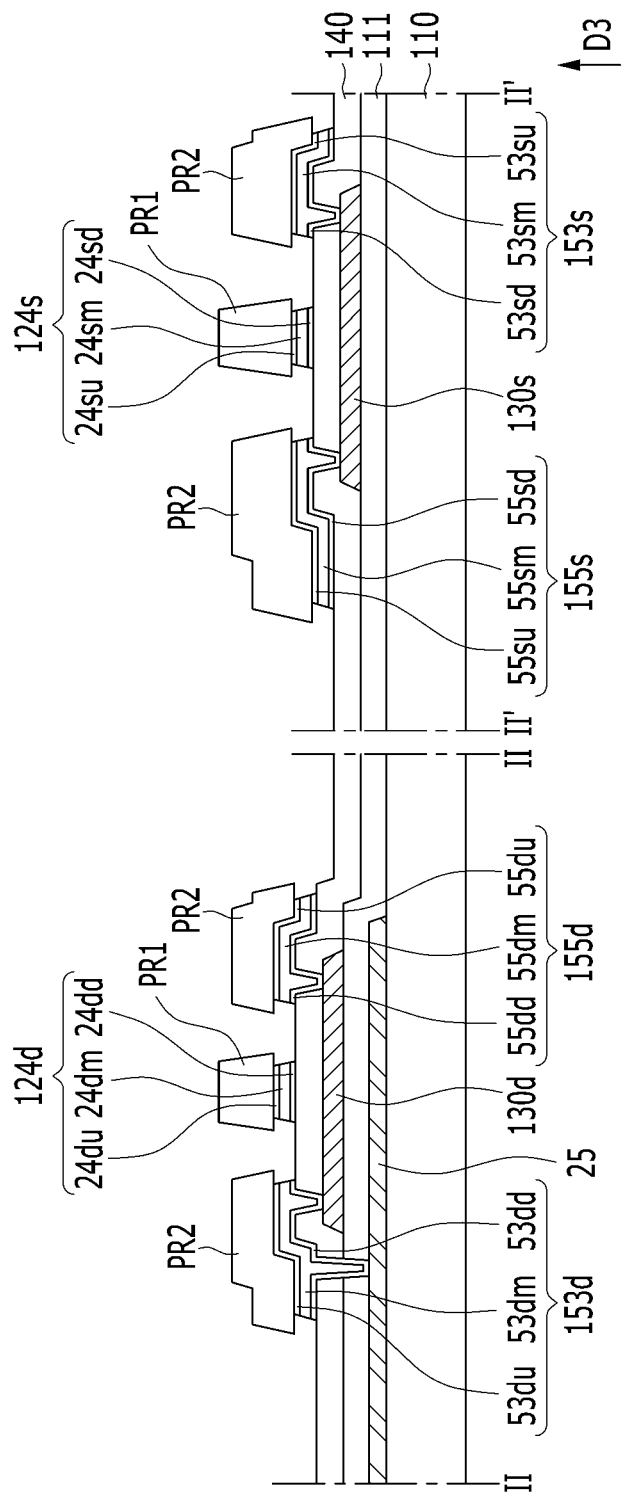
Figure 5:
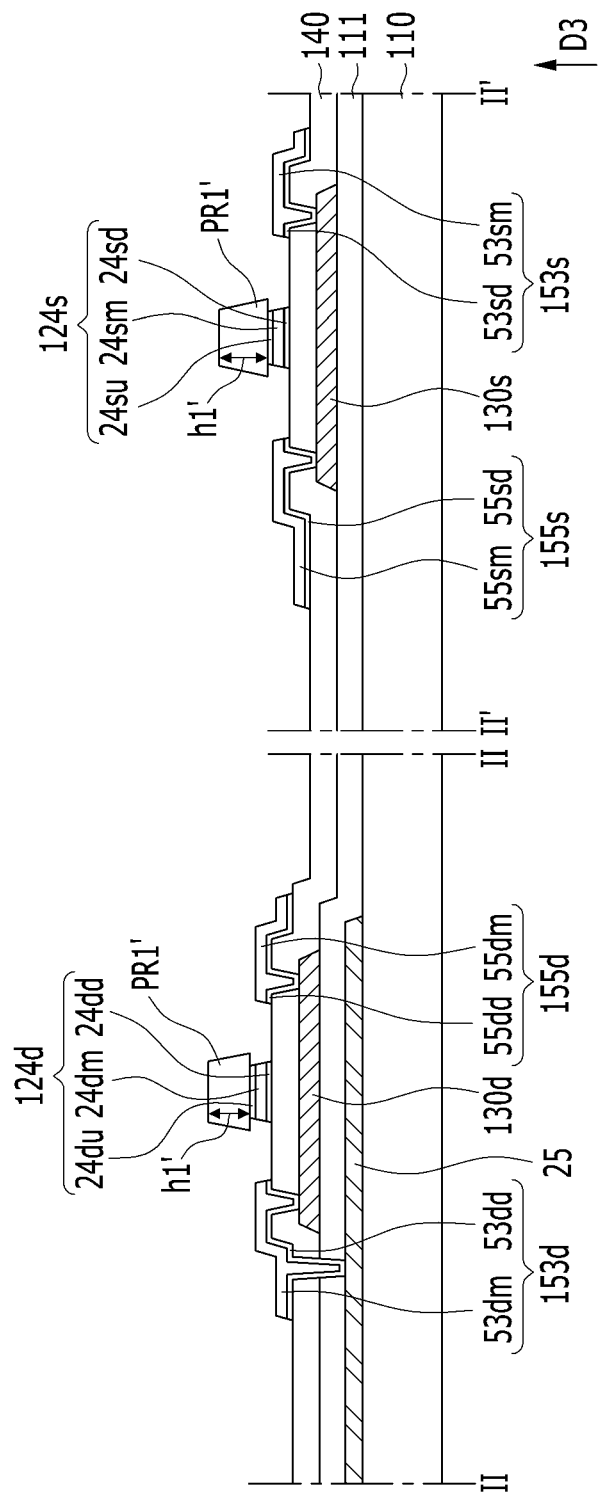
Figure 6:
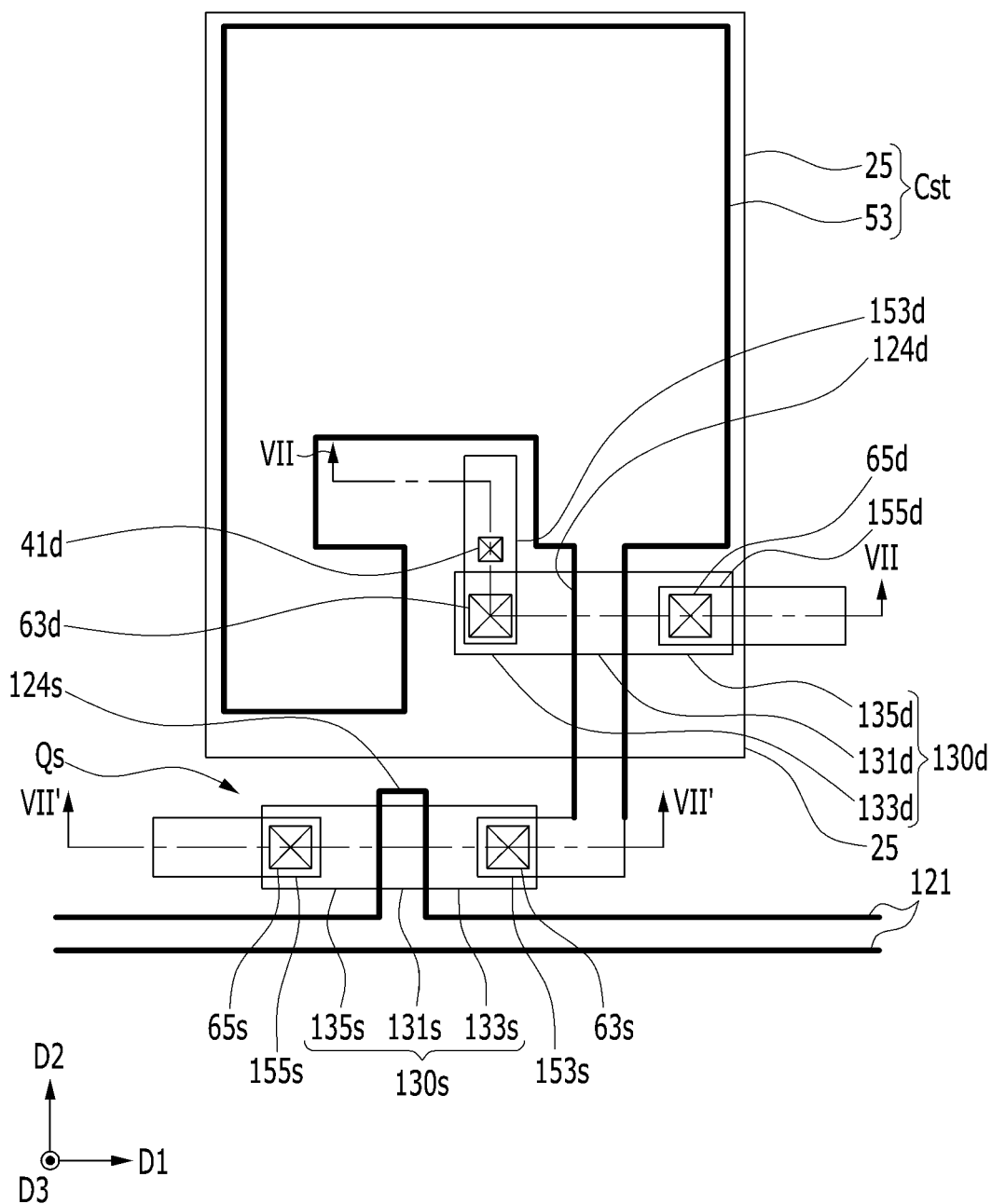
FIG. 6 is a top plan view of a step following that of FIG. 5.
Figure 7:
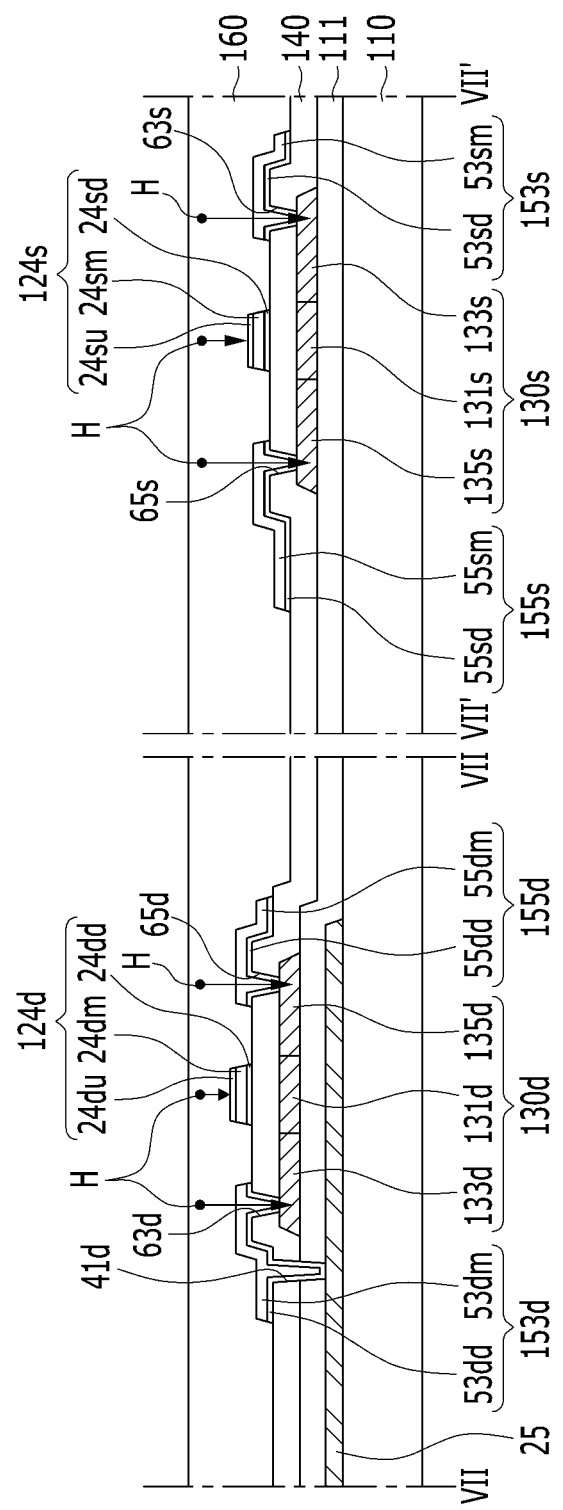
FIG. 7 is a cross-sectional view taken along line VII-VII and VII'-VII' of FIG. 6.

FIG. 3 to FIG. 5 are cross-sectional views showing a manufacturing method of a transistor display panel according to an exemplary embodiment as cross-sectional views taken along lines II-II and II'-I' of FIG. 1, FIG. 6 is a top plan view of a step following that of FIG. 5, and FIG. 7 is a cross-sectional view taken along line VII-VII and VII'-VII' of FIG. 6.

First, as shown in FIG. 3, a conductive material such as a metal is deposited on a substrate 110 through a sputtering method, and is patterned by using a photosensitive material such as a photoresist and a first mask to form a lower electrode 25. Also, on the substrate 110 having the lower electrode 25, an inorganic insulating material such as a silicon oxide (SiOx), a silicon nitride (SiNx), aluminum oxide (Al2O3), hafnium oxide (HfO3), yttrium oxide (Y2O3), and the like is deposited by a chemical vapor deposition (CVD) method to form a buffer layer 111.

Next, an oxide semiconductor material such as zinc oxide (ZnO), zinc-tin oxide (ZTO), zinc-indium oxide (ZIO), indium oxide (InO), titanium oxide (TiO), indium-gallium-zinc oxide (IGZO), indium-zinc-tin oxide (IZTO), and the like is deposited on the buffer layer 111 through a chemical vapor deposition method and is patterned by using a second mask to form a first semiconductor 130d and a second semiconductor 130s.

Also, on the substrate 110 including the first semiconductor 130d and the second semiconductor 130s, an inorganic insulating material such as a silicon oxide (SiOx), a silicon nitride (SiNx), silicon oxynitride (SiON), and the like is deposited through the chemical vapor deposition method to form a first insulating layer 140. Next, the first insulating layer 140 is patterned by using a third mask to form a first opening 63d, a second opening 65d, a third opening 63s, and a fourth opening 65s. In this case, the first insulating layer 140 and the buffer layer 111 are simultaneously patterned to form a lower opening 41d.

Also, a conductive material such as metal is deposited on the first insulating layer 140 through the sputtering method to form a gate electrode layer. The gate electrode layer is formed by sequentially depositing a triple layer of a lower electrode layer 120d with a thickness of about 100 to 200 Å, a main electrode layer 120m, and an upper electrode layer 120u with a thickness of about 100 to 200 Å. The thickness of the main electrode layer 120m is greater than the thickness of the lower electrode layer 120d or the upper electrode layer 120u.

A photosensitive film is formed on the gate electrode layer. The photosensitive film is patterned by using a half-tone mask 1000 as a fourth mask to form a first photosensitive film PR1 and a second photosensitive film PR2. In this case, the half-tone mask has a first portion A1 blocking most of a light, a second portion A2 blocking a part of a light, and a third portion A3 transmitting most of a light. Accordingly, the photosensitive film that is presented at the position corresponding to the third portion A3 is removed by an exposure and developing process. Further, only the first photosensitive film PR1 that is presented at the position corresponding to the first portion A1 and the second photosensitive film PR2 that is presented at the position corresponding to the second portion A2 remain. In this case, the second photosensitive film PR2 is partially exposed and developed such that the thickness h2 of the second photosensitive film PR2 is smaller than the thickness h1 of the first photosensitive film PR1.

Next, as shown in FIG. 4, the gate electrode layer is firstly wet-etched by using the patterned first photosensitive film PR1 and second photosensitive film PR2 as an etching mask to form a first gate electrode 124d, a second gate electrode 124s, a first source connecting member 153d, a first drain connecting member 155d, a second drain connecting member 155s, and a second source electrode 153s.

The first gate electrode 124d and the second gate electrode 124s are formed at the position corresponding to the first photosensitive film PR1, and the first source connecting member 153d, the first drain connecting member 155d, the second drain connecting member 155s, and the second source electrode 153s are formed at the position corresponding to the second photosensitive film PR2.

The first gate electrode 124d includes a first main gate layer 24dm, a first lower gate layer 24dd, and a first upper gate layer 24du of the same pattern. In addition, the second gate electrode 124s includes a second main gate layer 24sm, a second lower gate layer 24sd, and a second upper gate layer 24su of the same pattern. The first source connecting member 153d includes a first main source connecting layer 53dm, a first lower source connecting layer 53dd, and a first upper source connecting member 53du of the same pattern, and the first drain connecting member 155d includes a first main drain connecting layer 55dm, a first lower drain connecting layer 55dd, and a first upper drain connecting member 55du of the same pattern. Further, the second drain connecting member 155s includes a second main drain connecting member 55sm, a second lower drain connecting member 55sd, and a second upper drain connecting member 55su of the same pattern, and the second source electrode 153s includes a second main source electrode 53sm, a second lower source electrode 53sd, and a second upper source electrode 53su of the same pattern.

Next, as shown in FIG. 5, an ashing process is performed to remove the second photosensitive film PR2 formed on the first source connecting member 153d, the first drain connecting member 155d, the second drain connecting member 155s, and the second source electrode 153s. In this case, the first photosensitive film PR1 that is thicker than the second photosensitive film PR2 is not removed, and a partial photosensitive film PR1' remains. A thickness h1' of the partial photosensitive film PR1' is smaller than the thickness h1 of the first photosensitive film PR1. Next, a second wet etching process is performed on the first source connecting member 153d, the first drain connecting member 155d, the second drain connecting member 155s, and the second source electrode 153s that are exposed to remove the first upper source connecting member 53du, the first upper drain connecting member 55du, the second upper drain connecting member 55su, and the second upper source electrode 53su as the upper layer. Accordingly, the first source connecting member 153d, the first drain connecting member 155d, the second drain connecting member 155s, and the second source electrode 153s are formed as a double layer, and the first gate electrode 124d and the second gate electrode 124s are formed as a triple layer.

Next, as shown in FIG. 6 and FIG. 7, an inorganic insulating material such as a silicon oxide (SiOx), a silicon nitride (SiNx), and silicon oxynitride (SiON) is deposited through the chemical vapor deposition method to form a second insulating layer 160 with the structure of a single layer or a multilayer.

Since the first source connecting member 153d, the first drain connecting member 155d, the second drain connecting member 155s, and the second source electrode 153s are formed as a double layer, the thickness thereof is thin such that hydrogen (H) included in the second insulating layer 160 is diffused in the first source region 133d, the first drain region 135d, the second source region 133s, and the second drain region 135s. However, since the first gate electrode 124d and the second gate electrode 124s are formed as a triple layer, hydrogen (H) of the second insulating layer 160 is prevented from being diffused in the first channel 131d and the second channel 131s overlapping the first gate electrode 124d and the second gate electrode 124s.

As above-described, the first gate electrode 124d and the second gate electrode 124s are formed as a triple layer, and the first source connecting member 153d, the first drain connecting member 155d, the second drain connecting member 155s, and the second source electrode 153s are formed as a double layer; therefore, only the first source region 133d, the first drain region 135d, the second source region 133s, and the second drain region 135s may be conductive. Accordingly, a process of separately etching the first insulating layer 140 covering the first semiconductor 130d and the second semiconductor 130s to only expose the first source region 133d, the first drain region 135d, the second source region 133s, and the second drain region 135s may be omitted. Accordingly, a number of manufacturing processes and a manufacturing time may be minimized, thereby reducing manufacturing cost.

Next, as shown in FIG. 1 and FIG. 2, the second insulating layer 160 is patterned by using a fifth mask to form a first contact hole 68d overlapping the first source connecting member 153d, a second contact hole 61d overlapping the first drain connecting member 155d, and a third contact hole 61s overlapping the second drain connecting member 155s.

Next, a conductive material such as metal is deposited on the second insulating layer 160 through the sputtering method, and is patterned by using a sixth mask to form a data line 171 having a second drain electrode 175s, a driving voltage line 172 having a first drain electrode 175d, and a first source electrode 173d.

Also, a passivation layer 180 covering the data line 171 having the second drain electrode 175s, the driving voltage line 172 having the first drain electrode 175d, and the first source electrode 173d is formed. Next, a pixel contact hole 81 overlapping the first source electrode 173d is formed in the passivation layer 180 by using a seventh mask. A pixel electrode 191 is then formed on the passivation layer 180. The pixel electrode 191 is connected to the first source electrode 173d through the pixel contact hole 81.

The display device including the transistor display panel according to an exemplary embodiment will now be described with reference to FIG. 8 and FIG. 9.

Figure 8:
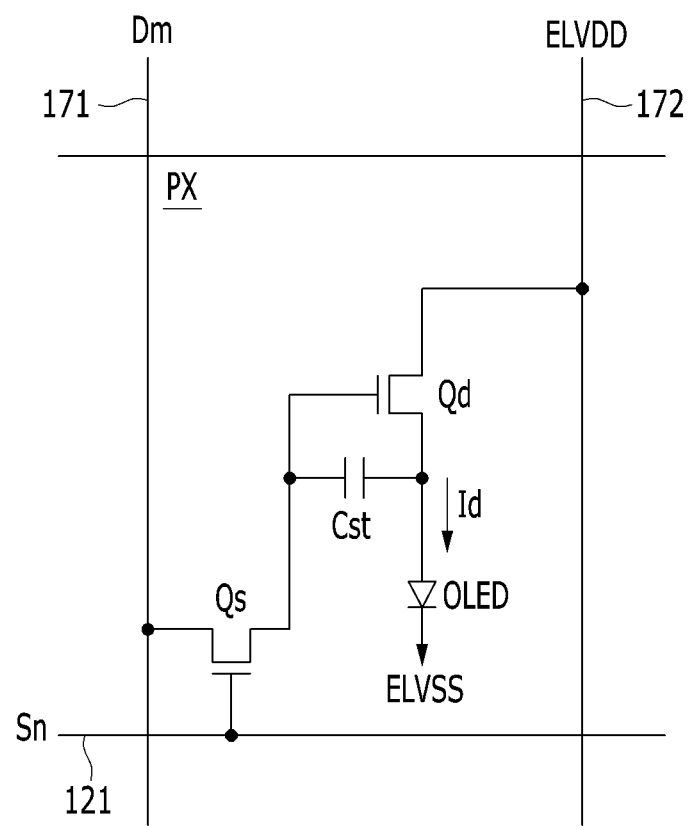
FIG. 8 is an equivalent circuit diagram of one pixel of a display device including a transistor display panel according to an exemplary embodiment.
Figure 9:
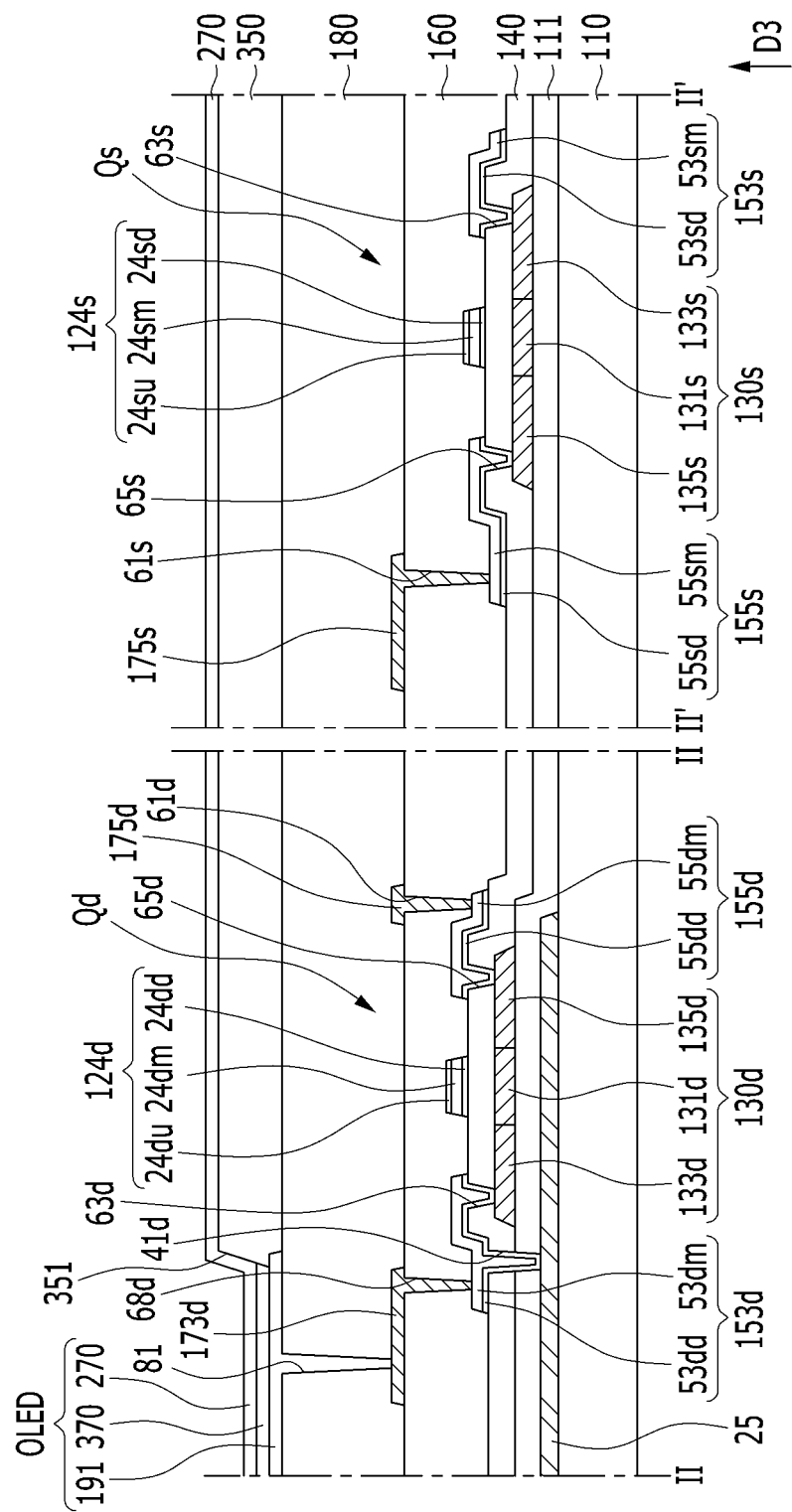
FIG. 9 is a cross-sectional view of a display device of FIG. 8.

FIG. 8 is an equivalent circuit diagram of one pixel of a display device including a transistor display panel according to an exemplary embodiment, and FIG. 9 is a cross-sectional view of a display device of FIG. 8.

The display device according to the present exemplary embodiment is an organic light emitting diode display, and may include the transistor display panel according to the above-described exemplary embodiment.

As shown in FIG. 8, one pixel PX of the display device including the transistor display panel according to an exemplary embodiment includes signal lines 121, 171, and 172, a plurality of transistors Qd and Qs connected to the signal lines 121, 171, and 172, a storage capacitor Cst, and an organic light emitting diode (OLED).

The plurality of signal lines 121, 171, and 172 include a scan line 121 transmitting a scan signal Sn, a data line 171 transmitting a data signal Dm, and a driving voltage line 172 transmitting a driving voltage ELVDD.

The plurality of transistors Qd and Qs include a driving transistor Qd and a switching transistor Qs.

The switching transistor Qs has a control terminal, an input terminal, and an output terminal, wherein the control terminal is connected to the scan line 121, the input terminal is connected to the data line 171, and the output terminal is connected to the driving transistor Qd. The switching transistor Qs transmits the data signal Dm applied to the data line 171 to the driving transistor Qd in response to the gate signal Sn applied to the gate line 121.

The driving transistor Qd also has a control terminal, an input terminal, and an output terminal, wherein the control terminal is connected to the switching transistor Qs, the input terminal is connected to the driving voltage line 172, and the output terminal is connected to the organic light emitting diode (OLED). The driving transistor Qd flows a driving current Id having a magnitude that is changed depending on a voltage applied between the control terminal and the output terminal.

The storage capacitor Cst is connected between the control terminal and the output terminal of the driving transistor Qd. The storage capacitor Cst charges the data signal applied to the control terminal of the driving transistor Qd and maintains it after the switching transistor Qs is turned off.

The organic light emitting diode (OLED) has an anode connected to the output terminal of the driving transistor Qd and a cathode connected to a common voltage ELVSS. The organic light emitting diode (OLED) emits light by changing its intensity depending on an output current Id, thereby displaying an image.

The switching transistor Qs and the driving transistor Qd may be n-channel electric field effect transistors (FET) or p-channel electric field effect transistors. However, a connection relationship of the transistors Qs and Qd, the storage capacitor Cst, and the organic light emitting diode (OLED) may be changed.

A detailed cross-sectional structure of the transistor display panel shown in FIG. 8 will be described in detail with reference to FIG. 9. In this case, the description for the above-described constituent elements is omitted.

As shown in FIG. 9, a pixel defining layer 350 is formed on the passivation layer 180 and an edge portion of the pixel electrode 191. The pixel defining layer 350 includes a pixel opening 351 that exposes the pixel electrode 191. The pixel definition layer 350 may include a polyacrylate resin, a polyimide resin, a silica-based inorganic material, etc.

An organic emission layer 370 is positioned in the pixel opening 351 of the pixel defining layer 350. The organic emission layer 370 may include at least one of an emission layer, a hole injection layer (HIL), a hole transporting layer (HTL), an electron transporting layer (ETL), and an electron injection layer (EIL). When the organic emission layer 370 includes all of these layers, the hole injection layer may be disposed on the pixel electrode 191, which is an anode electrode, and the hole transporting layer, the emission layer, the electron transporting layer, and the electron injection layer may be sequentially stacked on the hole injection layer.

A common electrode 270 is positioned on the pixel definition layer 350 and the organic emission layer 370. The common electrode 270 may be made of a transparent conductive material such as ITO (indium tin oxide), IZO (indium zinc oxide), ZnO (zinc oxide), or $In_2O_3$ (indium oxide), or a reflective metal such as lithium (Li), calcium (Ca), lithium fluoride/calcium (LiF/Ca), lithium fluoride/aluminum (LiF/Al), aluminum (Al), silver (Ag), magnesium (Mg), and gold (Au). The common electrode 270 becomes the cathode of the organic light emitting diode (OLED). The pixel electrode 191, the organic emission layer 370, and the common electrode 270 form the organic light emitting diode (OLED). The pixel electrode 191 may be the anode of the organic light emitting diode (OLED), and the common electrode 270 may be the cathode of the organic light emitting diode (OLED).

The light emitted from the organic emission layer 370 may be emitted toward and under the substrate 110 through the substrate 110 directly or by several reflections, or may be emitted in an upper direction of the substrate 110 (i.e., away from the substrate 110) without passing through the substrate 110.

An encapsulation layer (not shown) protecting the organic light emitting diode (OLED) may be positioned on the common electrode 270.

While this disclosure has been described in connection with exemplary embodiments, it is to be understood that the disclosure is not limited to the disclosed embodiments, but, on the contrary, is intended to cover various modifications and equivalent arrangements included within the spirit and scope of the appended claims.

What is claimed is:

1. A transistor display panel comprising:
   a substrate;
   a lower electrode disposed on the substrate;
   a buffer layer disposed on the lower electrode;
   a transistor disposed on the substrate; and
   a pixel electrode electrically connected to the transistor,
   wherein the transistor includes:
   a semiconductor layer disposed on the substrate;
   a gate electrode overlapping a part of the semiconductor layer; and
   a first electrode and a second electrode disposed on the gate electrode,
   wherein the lower electrode is electrically connected to the pixel electrode, and
   wherein the lower electrode is disposed between the substrate and the transistor along a thickness direction of the substrate.

2. The transistor display panel of claim 1, wherein the gate electrode includes a main gate layer and a lower gate layer under the main gate layer.

3. The transistor display panel of claim 2, wherein the first electrode includes a main first layer and a lower first layer disposed thereunder, and the second electrode includes a main second layer and a lower second layer disposed thereunder.

4. The transistor display panel of claim 1, wherein the pixel electrode is electrically connected to the first electrode.

5. The transistor display panel of claim 1, further comprising:
   a light-emitting diode element electrically connected to the transistor and comprising the pixel electrode, an emission layer, and a common electrode.

6. A transistor display panel comprising:
   a substrate;
   a lower electrode disposed on the substrate;
   a buffer layer disposed on the lower electrode;
   a transistor disposed on the substrate;
   a pixel electrode electrically connected to the transistor;
   a scan line disposed on the substrate;
   a data line crossing the scan line; and
   a second transistor electrically connected to the scan line and the data line,
   wherein the transistor includes:
   a semiconductor layer disposed on the substrate;
   a gate electrode overlapping a part of the semiconductor layer; and
   a first electrode and a second electrode disposed on the gate electrode,
   wherein the lower electrode is electrically connected to the pixel electrode, and
   wherein the second transistor includes a second semiconductor layer disposed on a same layer as the semiconductor layer, and a second gate electrode overlapping a part of the second semiconductor layer.

7. The transistor display panel of claim 6, wherein the second gate electrode includes at least two layers.

8. The transistor display panel of claim 6, wherein the semiconductor layer and the second semiconductor layer include an oxide semiconductor material.

9. The transistor display panel of claim 1, wherein the lower electrode includes a metal having at least one among copper (Cu), copper alloys, aluminum (Al), aluminum alloys, molybdenum (Mo) and molybdenum alloys.

10. The transistor display panel of claim 9, wherein the gate electrode includes a metal layer having at least one of molybdenum (Mo) and titanium (Ti).

11. The transistor display panel of claim 9, wherein the lower first layer and lower second layer include a metal layer having titanium (Ti).

12. The transistor display panel of claim 9, wherein the lower gate layer includes a metal layer having titanium (Ti).

13. The transistor display panel of claim 9, wherein the pixel electrode includes a transparent conductive material having an indium tin oxide (ITO).

14. The transistor display panel of claim 1, further comprising:
a storage capacitor electrically connected to the gate electrode,
wherein one electrode of the storage capacitor is disposed on a same layer as the gate electrode.

15. The transistor display panel of claim 14, wherein the one electrode of the storage capacitor and the gate electrode are formed as one body.

16. The transistor display panel of claim 14, wherein the one electrode of the storage capacitor extends from the gate electrode.

17. A display device comprising:
a substrate;
a lower electrode disposed on the substrate;
a semiconductor layer disposed on the lower electrode;
a gate electrode disposed on the semiconductor layer;
a first electrode and a second electrode disposed on the gate electrode and respectively electrically connected to a first region and a second region of the semiconductor layer; and
a pixel electrode electrically connected to the first electrode,
wherein the lower electrode is electrically connected to the first electrode and the pixel electrode, and
wherein the lower electrode is disposed between the substrate and the transistor along a thickness direction of the substrate.

18. The display device of claim 17, further comprising:
a buffer layer disposed on the lower electrode;
a first insulating layer disposed on the semiconductor layer; and
a second insulating layer disposed on the gate electrode,
wherein the first electrode is connected to the lower electrode through an opening in the buffer layer, the first insulating layer, and the second insulating layer.

19. The display device of claim 17, further comprising:
a scan line disposed on the substrate;
a data line crossing the scan line; and
a second transistor electrically connected to the scan line and the data line,
wherein the second transistor includes:
a second semiconductor layer disposed on a same layer as the semiconductor layer,
a second gate electrode overlapping a part of the second semiconductor layer, and
a second first electrode and a second electrode disposed on the same layer as the first electrode and the second electrode.

20. The display device of claim 17, wherein the lower electrode overlaps at least a part of a channel of the semiconductor layer in a plan view.

* * * * *